United States Patent [19]

Sogawa et al.

[11] Patent Number: 5,670,402
[45] Date of Patent: Sep. 23, 1997

[54] METHOD OF MANUFACTURING CORE IMPLANTED SEMICONDUCTOR DEVICES

[75] Inventors: Koichi Sogawa, Kobe; Yuichi Ando, Sanda, both of Japan

[73] Assignee: Ricoh Company, Ltd., Tokyo, Japan

[21] Appl. No.: 498,885

[22] Filed: Jul. 6, 1995

Related U.S. Application Data

[62] Division of Ser. No. 335,189, Nov. 7, 1994, abandoned, which is a continuation of Ser. No. 6,835, Jan. 21, 1993, abandoned.

[30] Foreign Application Priority Data

Feb. 7, 1992 [JP] Japan ................ 4-057040

[51] Int. Cl.$^6$ .................................... H01L 21/8246
[52] U.S. Cl. ........................ 437/48; 437/52; 437/45
[58] Field of Search ............................ 437/52, 48, 45, 437/60

[56] References Cited

U.S. PATENT DOCUMENTS

| | | | |
|---|---|---|---|
| 4,855,800 | 8/1989 | Esquivel et al. | 257/295 |
| 4,939,386 | 7/1990 | Shibata et al. | 307/304 |
| 5,032,881 | 7/1991 | Sardo et al. | 257/295 |
| 5,051,809 | 9/1991 | Kiyohara | 361/185 |
| 5,081,052 | 1/1992 | Kobayashi et al. | 437/45 |
| 5,308,781 | 5/1994 | Ando et al. | 437/48 |
| 5,362,662 | 11/1994 | Ando et al. | 437/48 |

*Primary Examiner*—Jey Tsai
*Attorney, Agent, or Firm*—Cooper & Dunham LLP

[57] ABSTRACT

In a semiconductor device, N-type diffusion regions for providing an LDD structure are formed on a P-type substrate. A thick CVD deposited insulating film is formed on both the diffusion regions. A word line layer is formed on this deposited insulating film and a gate oxide film in a direction crossing the diffusion regions. Since the deposited insulating film is set to be thick, a capacity between one of the diffusion regions as a bit line layer and the word line layer is reduced so that a reading speed of the semiconductor device is improved. Further, a punch through proof pressure is increased since the diffusion regions have an LDD structure. Thus, it is possible to provide a planar cell structure which increases the reading speed and is advantageous in a fine structure. Another semiconductor device is also shown. A method for manufacturing the semiconductor device is further shown.

9 Claims, 9 Drawing Sheets

METHOD OF MANUFACTURING CORE IMPLANTED SEMICONDUCTOR DEVICES

This is a division of application Ser. No. 08/335,189 filed Nov. 7, 1994, abandoned, which is a continuation of application Ser. No. 08/006,835 filed Jan. 21, 1993 abandoned.

BACKGROUND OF THE INVENTION

1. Field of the Invention

The present invention relates to a semiconductor memory device having a planar cell structure, a semiconductor device including the semiconductor memory device and a method for manufacturing the semiconductor device. The semiconductor memory device having the planar cell structure is used as a memory device such as a mask ROM, an EPROM, etc.

2. Description of the Related Art

In a general semiconductor integrated circuit device of a MOS type, elements are separated from each other by a field oxide film. A source region and a drain region are formed by implanting impurities into a substrate in a self-aligning method with a gate electrode as a mask. It is necessary to dispose one or two contacts of the source and drain regions with respect to one transistor. Accordingly, high integration is prevented by a contact margin and a wiring pitch. Therefore, to solve this problem, Japanese Patent Application Laying Open (KOKAI) Nos. 61-288464 and 63-96953 proposed a semiconductor integrated circuit device called a planar cell structure.

The planar cell structure has a continuous diffusion region for a source region of plural transistors and a continuous diffusion region for a drain region of the plural MOS transistors. These diffusion regions are formed on a substrate in parallel with each other. A gate electrode is formed on the substrate through an insulating film such that the gate electrode crosses both the diffusion regions. In the planar cell structure, it is not necessary to dispose a field oxide film for separating elements from each other. Further, the source and drain regions are commonly provided for the plural transistors. Accordingly, it is sufficient to dispose one contact with respect to several or several ten transistors, which is advantageous in high integration.

In a general method for manufacturing the memory device having the planar cell structure, a field oxide film, diffusion regions as a source and a drain of a memory region, a gate oxide film, and a gate electrode composed of polycrystal silicon are formed on the substrate. Thereafter, a resist pattern having an opening in a core portion (as a channel region) of a corresponding memory transistor is formed in accordance with data to be written. Ions are then implanted into the substrate, etc. A threshold voltage of this memory transistor is set to a high threshold voltage at which no memory transistor is turned on at a gate voltage in a reading operation of the data.

In the planar cell structure, there is a considerably large capacity between a bit line layer and a word line layer so that the reading speed of a memory section is reduced by this large capacity.

Each of diffusion regions has a single drain structure. Therefore, there is a problem about a pressure proof reduction caused by punch through when the structure of each of the diffusion regions is finely divided.

The planar cell structure is provided in a mask ROM so that data are generally written to the planar cell structure by a core implanting method. In the core implanting method, impurities having a high concentration are implanted into a channel region of a memory transistor to increase a threshold voltage value thereof. Core implantation is performed by using a resist pattern as a mask having an opening in a region wider than the channel region so as to prevent a shift in overlapping of mask patterns for implantation, etc. An implanting region for the core implantation is set to be wider than the channel region. Therefore, an ion in the core implantation is implanted into a region wider than each of the diffusion regions. Accordingly, junction capacitance is increased so that the reading speed is further reduced and junction leak is increased.

SUMMARY OF THE INVENTION

It is therefore a first object of the present invention to provide a semiconductor device having a planar cell structure which increases a reading speed of data and is advantageous in a fine structure.

A second object of the present invention is to provide a semiconductor device and a manufacturing method thereof for preventing semiconductor characteristics from being reduced by restraining ions for core implantation from being implanted into a diffusion region in the planar cell structure.

In a first structure of the present invention, a thick deposited insulating film is used as an insulating film for electrically insulating diffusion regions for a source and a drain from a word line layer to improve a reading speed of data and provide a planar cell structure advantageous in a fine structure. Each of the diffusion regions for a source and a drain has a high impurity concentration in a central portion thereof in a width direction and has a low impurity concentration in a peripheral portion thereof in the width direction, thereby providing a so-called LDD structure.

Concretely, in the first structure of the present invention, the above first object can be achieved by a semiconductor device comprising a diffusion region for a source region of plural memory transistors; a diffusion region for a drain region of the plural memory transistors; the diffusion regions for the source and drain regions being formed in the shape of a band on a substrate in parallel with each other; and a word line layer electrically insulated from both the diffusion regions and formed in a direction crossing both the diffusion regions and functioning as a gate electrode; the semiconductor device being constructed such that a thick deposited insulating film is formed as an insulating film for electrically insulating both the diffusion regions from the word line layer, and each of the diffusion regions has a high impurity concentration in a central portion thereof in a width direction and has a low impurity concentration in a peripheral portion thereof in the width direction.

In a second structure of the semiconductor device of the present invention, an insulating film is buried between word line layers to restrain ions for core implantation from being implanted into the diffusion regions.

Concretely, in the second structure of the present invention, the above second object can be achieved by a semiconductor device comprising a diffusion region for a source region of plural memory transistors; a diffusion region for a drain region of the plural memory transistors; the diffusion regions for the source and drain regions being formed in the shape of a band on a substrate in parallel with each other; and a word line layer electrically insulated from both the diffusion regions and formed in a direction crossing both the diffusion regions and functioning as a gate electrode; the semiconductor device being constructed such that an insulating film is buried between word line layers and ions for writing information are implanted into only a region in which the insulating film is not formed.

In a manufacturing method of the present invention, diffusion regions for a source and a drain, a gate oxide film and a word line layer are sequentially formed on a substrate. Thereafter, an insulating film having a thickness sufficient to be buried between word line layers is deposited. This insulating film is left only between the word line layers by etchback. Thereafter, a resist pattern is formed to have an opening in a channel region of a corresponding memory transistor in accordance with information to be stored. Ions for core implantation are implanted into the substrate, etc. with this resist pattern as a mask.

Concretely, the second object of the present invention can be achieved by a manufacturing method of a semiconductor device comprising the following process steps: (A) a process for forming a diffusion region for a source region of plural memory transistors and a diffusion region for a drain region of the plural memory transistors in the shape of a band on a semiconductor substrate in parallel with each other by implanting impurities into this semiconductor substrate; (B) an oxidizing process for forming a gate oxide film on a substrate surface between both the diffusion regions and forming an oxide film thicker than this gate oxide film on both the diffusion regions; (C) a process for depositing a conductive film on the substrate surface and forming a word line layer functioning as a gate electrode in a direction crossing both the diffusion regions by patterning the conductive film; (D) a process for depositing an insulating film having a thickness sufficient to be buried between word line layers and leaving this insulating film only between the word line layers by etchback; and (E) a core implanting process for forming a resist pattern having an opening in a channel region of a corresponding memory transistor in accordance with information to be stored and performing ion implantation with this resist pattern as a mask.

As mentioned above, in the first structure of the present invention, the thick deposited insulating film is used as an insulating film for electrically insulating a bit line layer and a word line layer from each other. Accordingly, a capacity between the bit line layer and the word line layer is reduced so that a reading speed of the semiconductor device can be increased.

The bit line layer has a high impurity concentration in a central portion thereof in a width direction and has a low impurity concentration in a peripheral portion thereof in the width direction, thereby providing an LDD structure. Accordingly, when a voltage is applied to the bit line layer, a proof pressure between a source and a drain is increased and the increased proof pressure is advantageous in a fine structure.

In the second structure of the present invention, the insulating film is buried between word line layers so that it is possible to restrain ions for core implantation from being implanted into the diffusion regions. Accordingly, it is possible to restrain junction capacitance and junction leak from being increased. Further, it is possible to manufacture the semiconductor device with improved yield.

Further objects and advantages of the present invention will be apparent from the following description of the preferred embodiments of the present invention as illustrated in the accompanying drawings.

BRIEF DESCRIPTION OF THE DRAWINGS

FIG. 2b is a cross-sectional view taken along line X–X' of FIG. 2a;

FIG. 2c is a cross-sectional view taken along line Y–Y' of FIG. 2a;

FIG. 5b is a cross-sectional view of the semiconductor device taken along line Z–Z' of FIG. 5a;

FIG. 5c is a cross-sectional view of the semiconductor device taken along line V–V' of FIG. 5a.

DESCRIPTION OF THE PREFERRED EMBODIMENTS

The preferred embodiments of a semiconductor device and a manufacturing method thereof in the present invention will next be described in detail with reference to the accompanying drawings.

Figure 1:
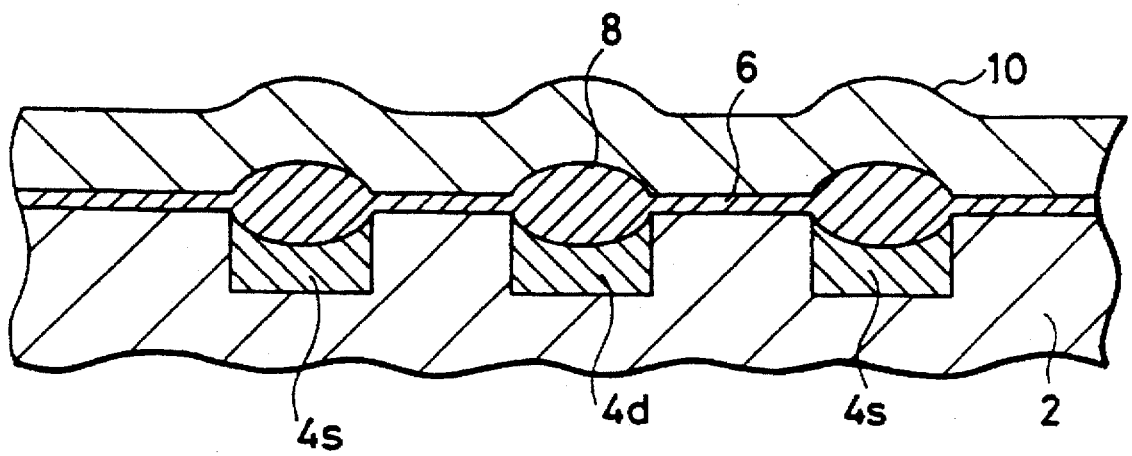
FIG. 1 is a cross-sectional view showing one example of a memory section of a general planar cell structure.

FIG. 1 shows one example of a memory section of the planar cell structure. A diffusion region 4s for a source and a diffusion region 4d for a drain are alternately formed on a P-type silicon substrate 2 in parallel with each other. The diffusion regions 4s and 4d are formed in the shape of a band and extend in a direction perpendicular to a paper face. A gate oxide film 6 is formed on a surface of the substrate 2. An oxide film 8 is formed on each of the diffusion regions 4s and 4d by speed increasing oxidation such that the oxide film 8 is thicker than the gate oxide film 6. A word line layer 10 is formed on the substrate 2 in a direction crossing the diffusion regions 4s and 4d.

In the planar cell structure shown in FIG. 1, for example, the diffusion region 4d forms a bit line layer and the diffusion region 4d and the word line layer 10 is separated from each other through the speed increasing oxide film 8. The speed increasing oxide film 8 is thicker than the gate oxide film 6, but has a thickness about 1500 Å. Therefore, there is a considerably large capacity between the diffusion region 4d and the word line layer 10 so that a reading speed of the memory section is reduced by this large capacity.

Each of the diffusion regions 4d and 4s has a single drain structure. Therefore, there is a problem about a pressure proof reduction caused by punch through when the structure of each of the diffusion regions is finely divided.

Figure 2A:
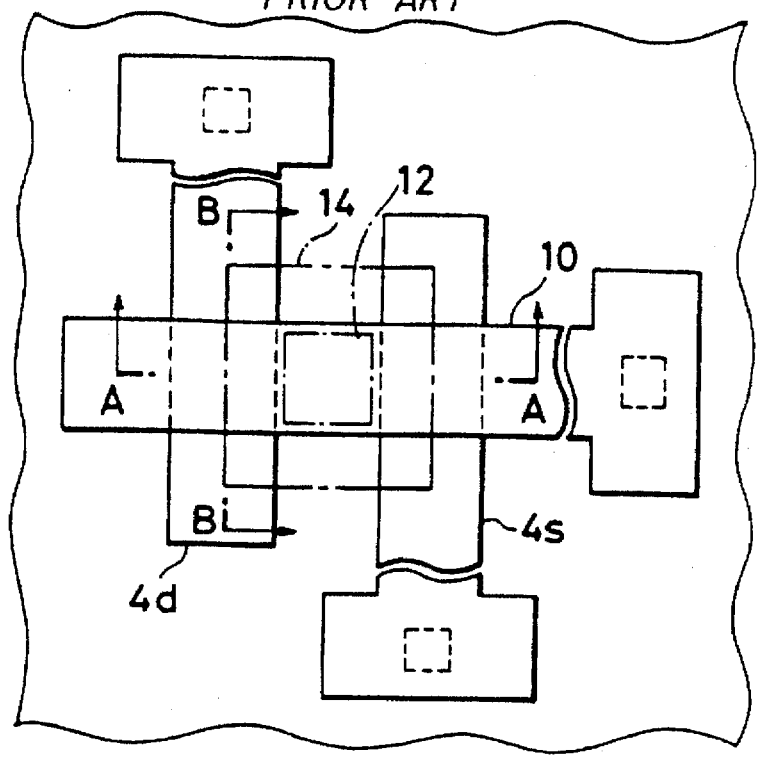
FIG. 2a is a plan view showing a core implanting process in the memory section of the general planar dell structure.
Figure 2B:
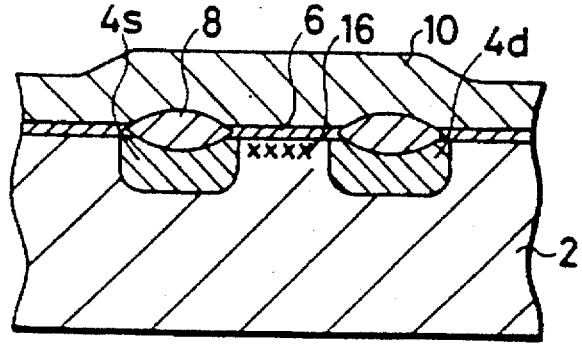
Figure 2C:
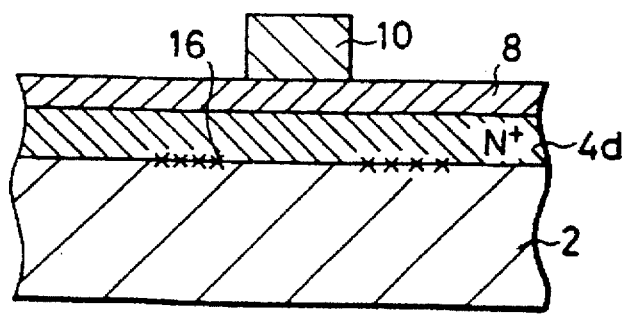

The planar cell structure is provided in a mask ROM so that data are generally written to the planar cell structure by a core implanting method. In the core implanting method, impurities having a high concentration are implanted into a channel region of a memory transistor to increase a threshold voltage value thereof. Core implantation is performed by using a resist pattern as a mask having an opening in a region wider than the channel region so as to prevent a shift in overlapping of mask patterns for implantation, etc. For example, as shown in FIG. 2, a channel region 12 is located on a lower side of the word line layer 10 between the diffusion regions 4d and 4s. An implanting region 14 for the core implantation into this channel region 12 is set to be wider than the channel region 12. Therefore, an ion 16 in the core implantation is implanted into a region wider than each of the diffusion regions 4d and 4s. Accordingly, junction capacitance is increased so that the reading speed is further reduced and junction leak is increased.

Figure 3:
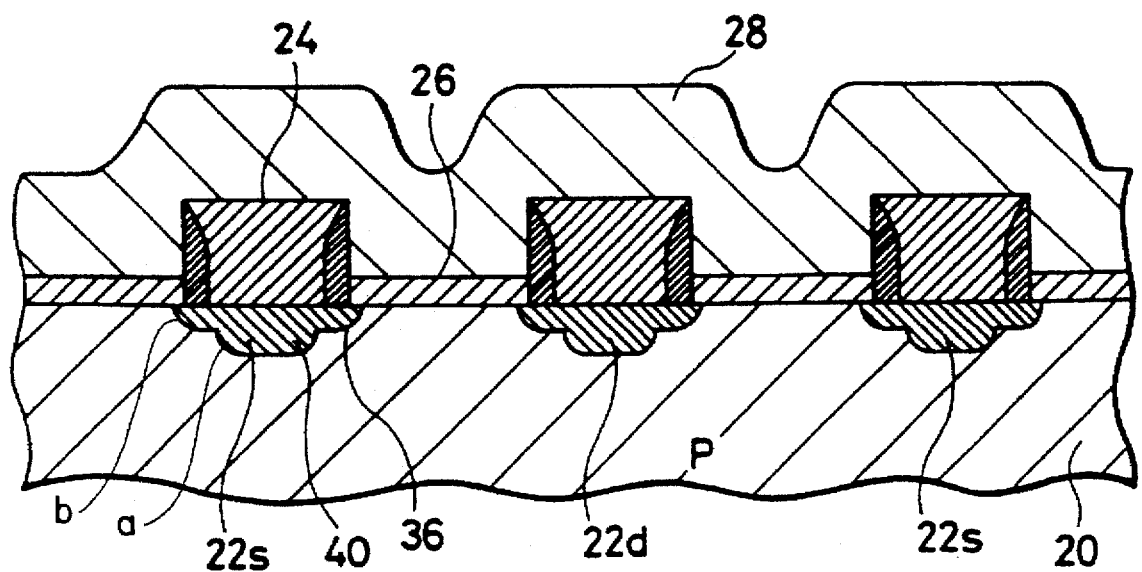
FIG. 3 is a cross-sectional view showing the construction of a semiconductor device in accordance with a first embodiment of the present invention.

FIG. 3 shows the construction of a semiconductor device corresponding to a first structure of the present invention.

In FIG. 3, N-type impurities of arsenic, phosphorus, etc. are implanted into a P-type silicon substrate 20. Diffusion regions 22s and 22d are formed in the shape of a band and extend in a direction perpendicular to a paper face. The diffusion regions 22s and 22d are alternately arranged in parallel with each other. Each of the diffusion regions 22s and 22d has a high impurity concentration in its central portion "a" in a width direction. Each of the diffusion regions 22s and 22d has an impurity concentration lower than the above high impurity concentration in its peripheral portion "b" in the width direction. Thus, a so-called LDD structure is provided for the diffusion regions 22s and 22d. An insulating film 24 is deposited and formed on each of the diffusion regions 22s and 22d by a CVD method, etc. For example, the insulating film 24 is constructed by a thick silicon oxide film having a thickness about 3000 Å. A speed increasing oxide film formed by speed increasing oxidation of the diffusion layers normally has a thickness about 1500 Å. However, this deposited oxide film 24 is formed and set to be thicker than this speed increasing oxide film. This structure constructs, one of the features of the present invention. A gate oxide film 26 is formed on the substrate 20. A word line layer 28 is formed in the shape of a band on the deposited oxide film 24 and the gate oxide film 26 in a direction parallel to a paper face. The word line layer 28 is arranged in a direction crossing the diffusion regions 22s and 22d.

In the planar cell structure shown in FIG. 3, the insulating film 24 on each of the diffusion regions 22s and 22d is thick so that a capacity between the diffusion region 22d as a bit line layer and the word line layer 28 is reduced. Accordingly, it is possible to increase the reading speed of a memory transistor. Further, since the diffusion regions 22s and 22d have the LDD structure, it is possible to increase a punch through proof pressure even when the structure of an element is finely divided.

A method for manufacturing the semiconductor device in the first embodiment shown in FIG. 3 will next be explained with reference to FIGS. 4a to 4g.

Figure 4A:
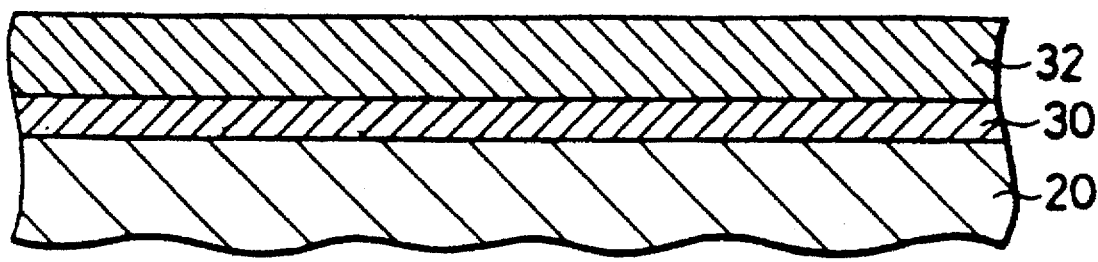
FIGS. 4a to 4d are cross-sectional views showing a former section of a manufacturing process of the semiconductor device in the first embodiment shown in FIG. 3.

(A) As shown in FIG. 4a, a silicon oxide film 30 is deposited on a silicon substrate 20 by a CVD method. For example, the silicon oxide film 30 has a thickness about 2000 Å. A silicon nitride film 32 is deposited on the silicon oxide film 30 by the CVD method. For example, the silicon nitride film 32 has a thickness about 3000 Å.

Figure 4B:
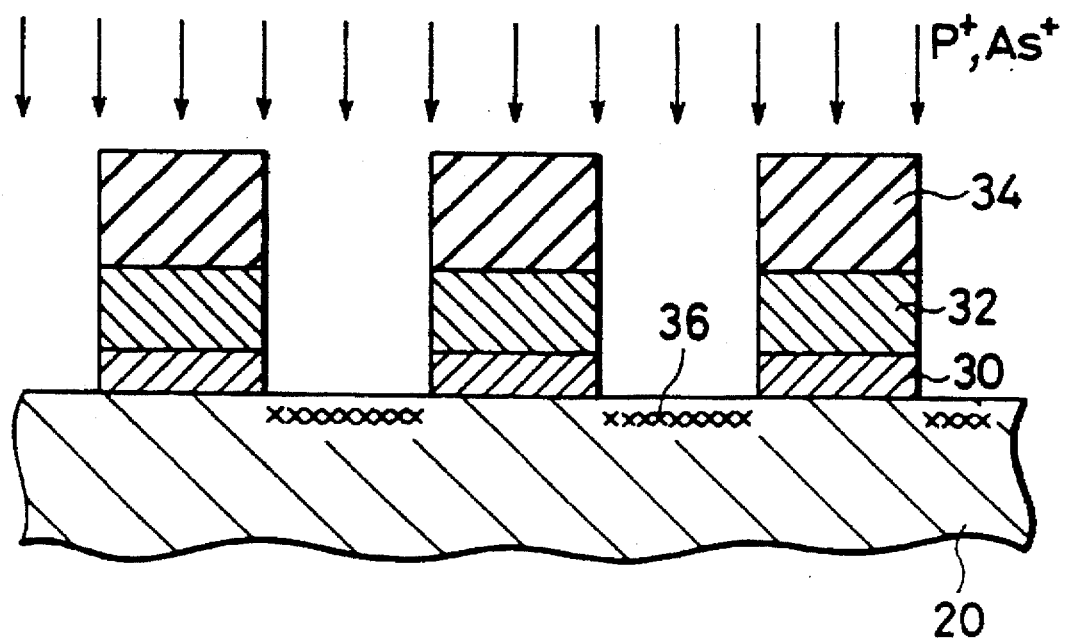

(B) As shown in FIG. 4b, a resist pattern 34 is formed on the silicon nitride film 32 by photolithography. The resist pattern 34 is constructed by a pattern having an opening in a region for forming a diffusion region. The silicon nitride film 32 and the silicon oxide film 30 are etched with the resist pattern 34 as a mask. Thus, a surface of the substrate 20 is exposed in a portion for forming the diffusion region.

At this stage, the silicon oxide film 30 may be left without etching this silicon oxide film 30.

N-type impurities of arsenic, phosphorus, etc. are then implanted into the substrate with the resist pattern 34 and the left silicon nitride film 32 as masks. An implanted ion is designated by reference numeral 36 in FIG. 4. For example, an amount of the implanted ion is set to about $5 \times 10^{13}/cm^2$.

Figure 4C:
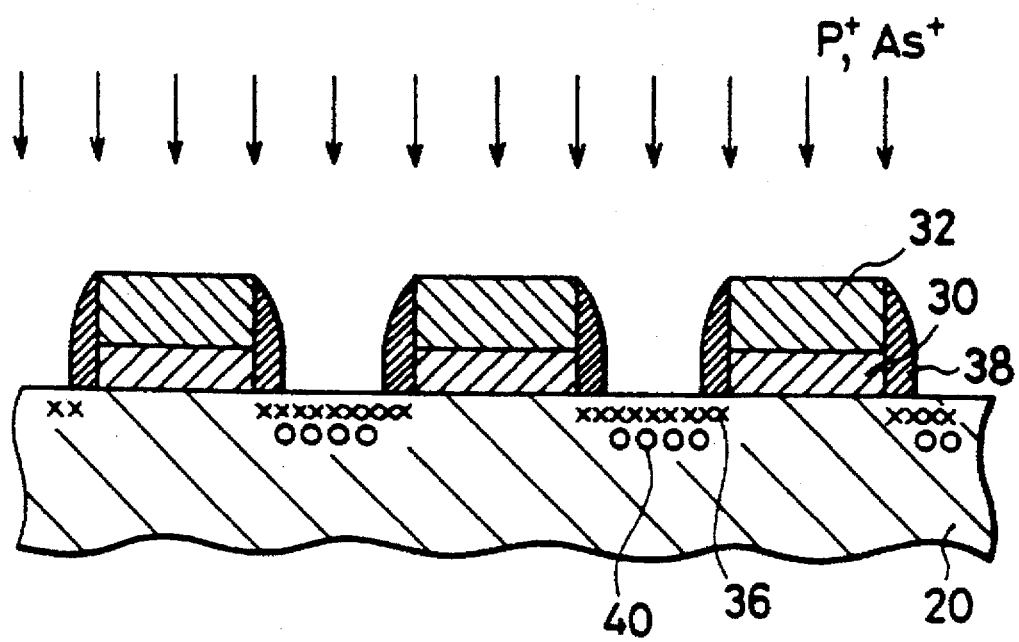

(C) As shown in FIG. 4c, after the resist pattern 34 is removed from the substrate, a silicon oxide film is deposited by the CVD method. Thereafter, a silicon oxide film 38 is left on a pattern side wall of each of the silicon oxide film 30 and the silicon nitride film 32 by etchback of the deposited silicon oxide film.

N-type impurities of arsenic, phosphorus, etc. are implanted into the substrate with the silicon oxide film 38 on the above side wall as a mask. For example, an amount of the implanted impurities is set to about $6 \times 10^{15}/cm^2$. Reference numeral 40 designates an N-type impurity ion having a high concentration and implanted into the substrate with the silicon oxide film 38 on the above side wall as a mask. Thus, the high concentration ion 40 is implanted into a central portion of a region for forming the diffusion region in a width direction thereof. An ion 36 having a low concentration is implanted into a peripheral portion of the region for forming the diffusion region in the width direction thereof.

Figure 4D:
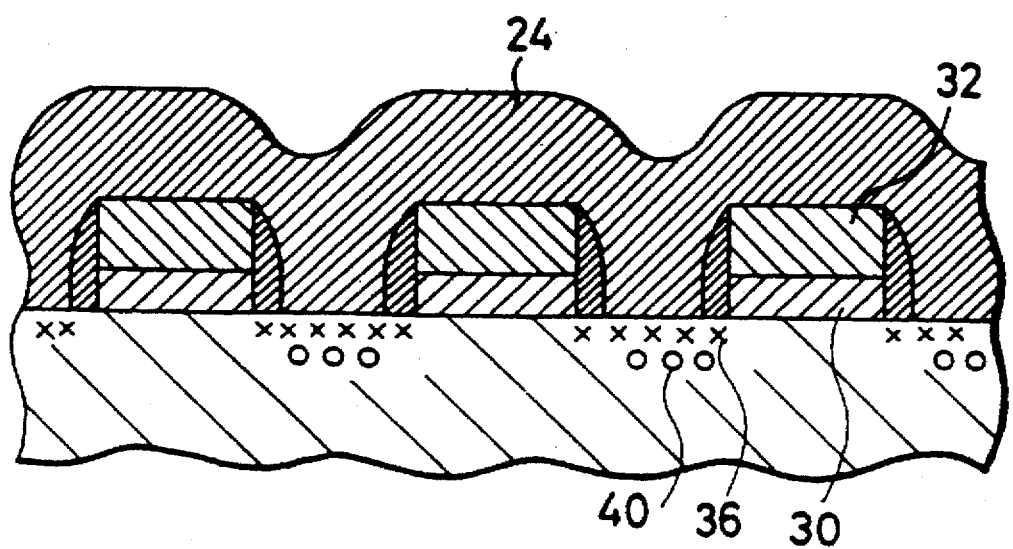

(D) As shown in FIG. 4d, a silicon oxide film 24 is deposited by the CVD method such that this silicon oxide film 24 has a thickness about 7000 Å.

Figure 4E:
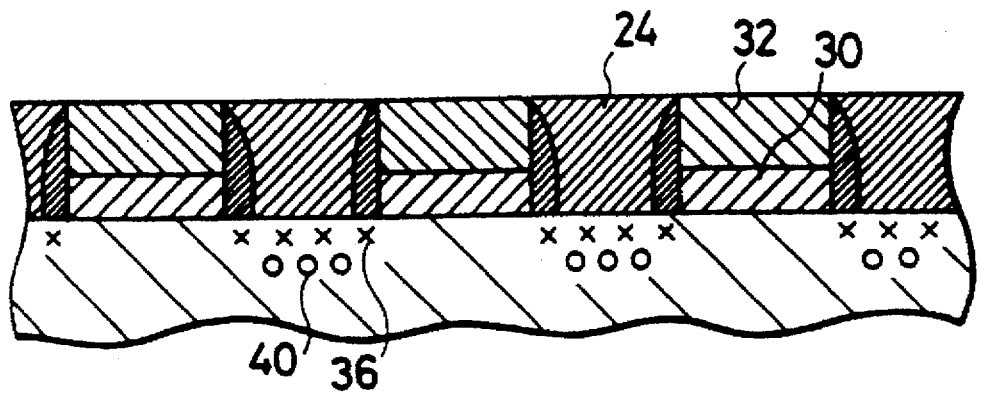
FIGS. 4e to 4g are cross-sectional views showing a latter section of the manufacturing process of the semiconductor device in the first embodiment shown in FIG. 3.

(E) As shown in FIG. 4e, etchback of the silicon oxide film 24 is performed until the thickness of a remaining portion of the silicon oxide film 24 is equal to about 5000 Å. Thus, the thickness of the left silicon oxide film 24 is approximately equal to a total of the thicknesses of the silicon oxide film 30 and the silicon nitride film 32.

Figure 4F:
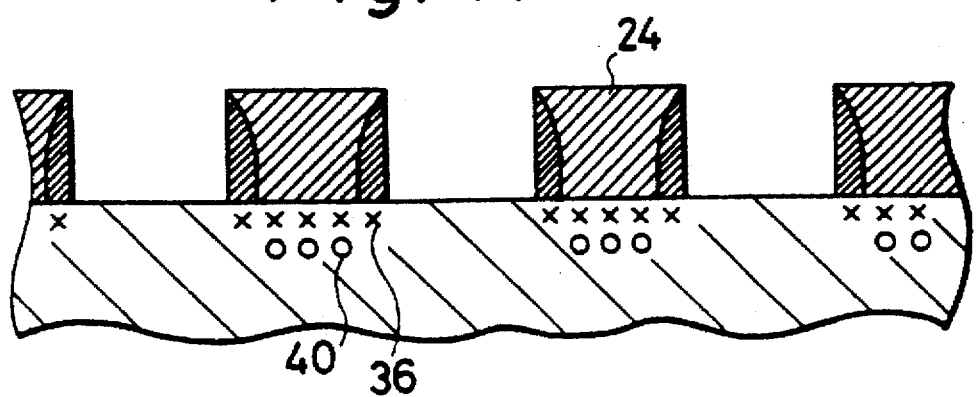

(F) Thereafter, as shown in FIG. 4f, the silicon nitride film 32 is removed from the substrate by wet etching or dry etching. Then, the silicon oxide film 30 is etched such that this silicon oxide film 30 has a thickness about 2000 Å. At this time, the silicon oxide film 24 is etched together with the silicon oxide film 80 such that this silicon oxide film 24 has a thickness about 2000 Å. Thus, the thickness of a remaining portion of the silicon oxide film 24 is set to about 3000 Å.

Figure 4G:
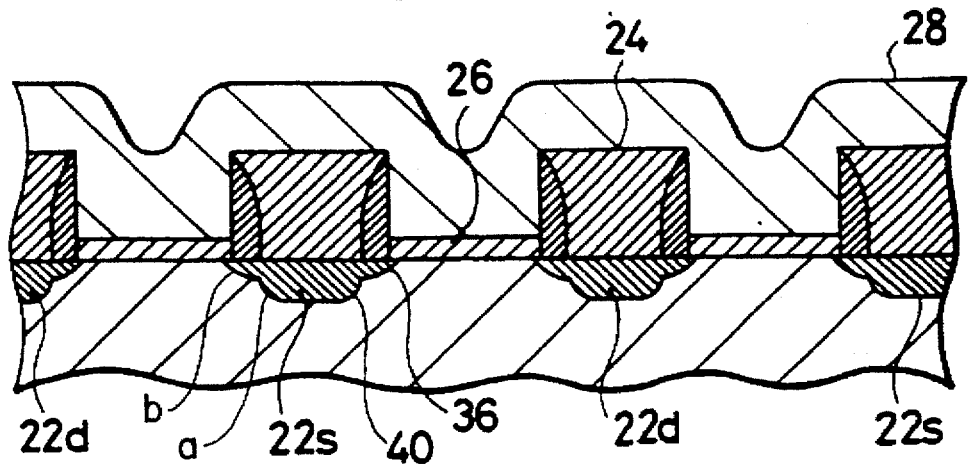

(G) As shown in FIG. 4g, a gate oxide film 28 is formed by thermal oxidation on an exposed surface of the substrate 20. For example, the gate oxide film 26 has a thickness about 150 Å. The N-type impurity ion implanted into the substrate is activated in a process of heat treatment for forming the gate oxide film 26 so that diffusion regions 22d and 22s are formed. Each of these diffusion regions is deep on its inner side "a" in a width direction and has a high concentration. Each of these diffusion regions is shallow on its outer side "b" and has a low concentration.

Thereafter, a polycrystal silicon layer 28 is deposited and patterned so that a word line layer is formed.

Figure 5A:
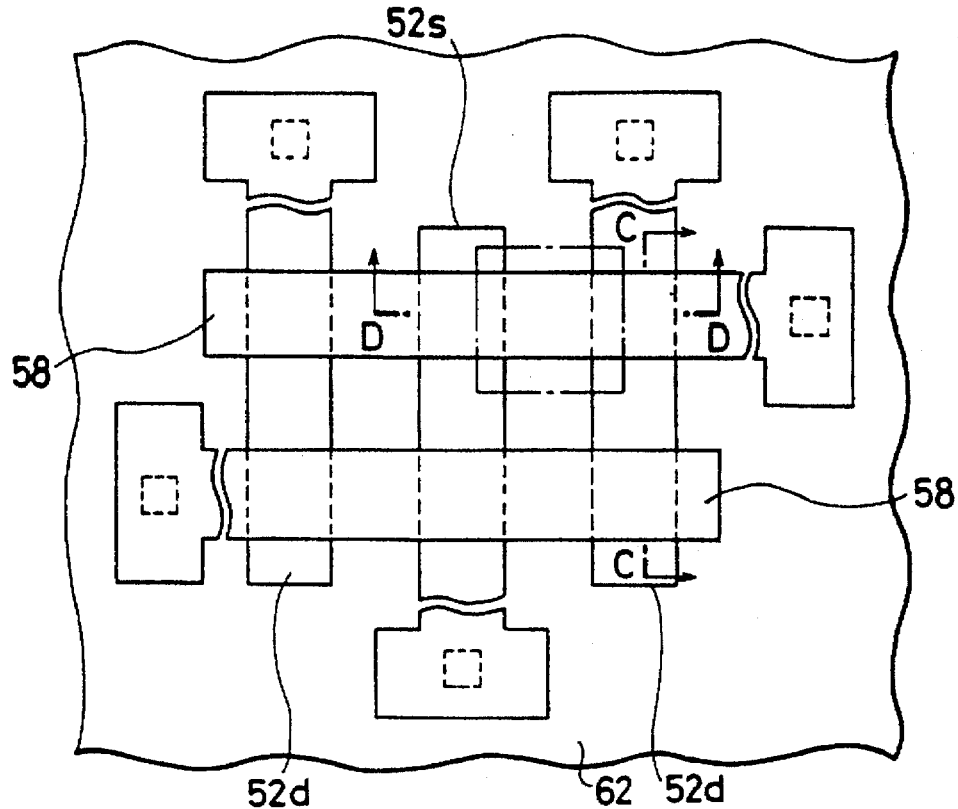
FIG. 5a is a plan view showing the construction of a semiconductor device in accordance with a second embodiment of the present invention.
Figure 5B:
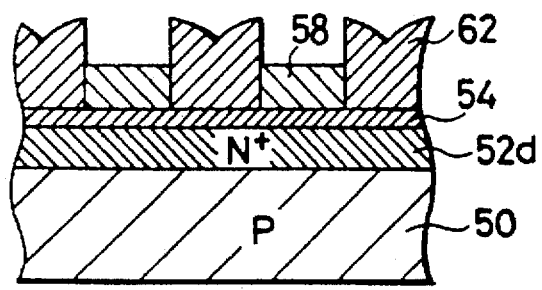
Figure 5C:
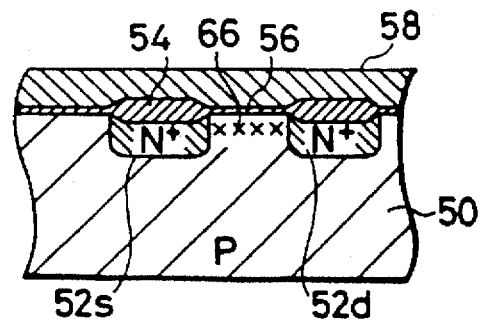

FIGS. 5a to 5c show the construction of a semiconductor device corresponding to a second structure in accordance with a second embodiment of the present invention. FIG. 5a is a plan view showing the semiconductor device in the second embodiment of the present invention. FIG. 5b is a cross-sectional view of the semiconductor device taken along line Z–Z' of FIG. 5a. FIG. 5c is a cross-sectional view of the semiconductor device taken along line V–V' of FIG. 5a.

In FIG. 5, N-type diffusion regions 52s and 52d are formed in the shape of a band on a P-type silicon substrate 50 and are alternately arranged in parallel with each other. A silicon oxide film 54 is formed by speed increasing oxidation on each of the diffusion regions 52s and 52d. A gate oxide film 56 is formed on a substrate surface between the diffusion regions 52s and 52d. A word line layer 58 is formed in the shape of a band on the substrate in a direction crossing the diffusion regions 52s and 52d. An insulating film 62 such as a silicon oxide film is buried onto the substrate in a region between word line layers 58.

As shown by a broken line in FIG. 5a, core implantation for writing information is performed through a mask having an opening in a region wider than a channel region. A region except for the word line layer 58 is covered with a thick insulating film 62. Accordingly, no ion for the core implantation is implanted into the diffusion regions on a lower side of the insulating film 62. Reference numeral 66 mainly designates the ion for the core implantation implanted into the channel region.

In this embodiment, the core implantation of the ion implanted into the diffusion regions 52s and 52d is restrained. Accordingly, it is possible to prevent junction capacitance and junction leak from being increased. Therefore, it is possible to increase a reading speed of the semiconductor device and restrain semiconductor characteristics from being reduced.

A method for manufacturing the semiconductor device in the second embodiment shown in FIG. 5 will next be explained with reference to FIG. 6.

Figure 6A:
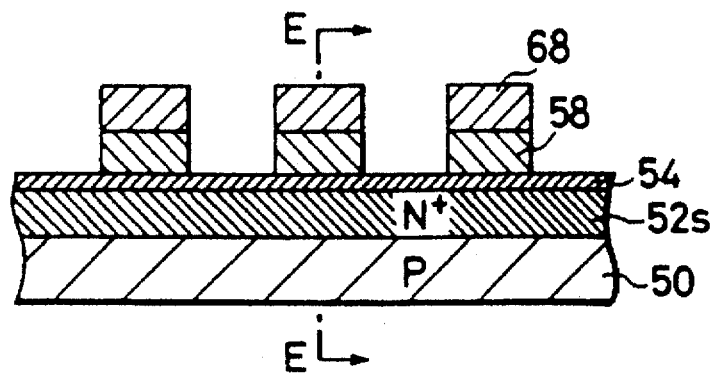
FIGS. 6a to 6f are cross-sectional views showing manufacturing processes in a manufacturing method of the semiconductor device in the second embodiment of the present invention shown in FIGS. 5a to 5c.

(A) As shown in FIG. 6a, a resist pattern is formed on a P-type silicon substrate 50 to form diffusion regions 52s and 52d. N-type impurities of arsenic, phosphorus, etc. are implanted into the substrate with this resist pattern as a mask.

After the resist pattern is removed from the substrate, a gate oxide film 56 having a thickness from 100 to 500 Å is formed by thermal oxidation on a substrate surface except for the diffusion regions 52s and 52d. Simultaneously, a speed increasing oxide film 54 is formed on each of the diffusion regions 52s and 52d such that this speed increasing oxide film 54 is thicker than the gate oxide film 56.

Thereafter, a polycrystal silicon film or a polycide film 58 is deposited on the substrate such that this film 58 has a thickness from 2000 to 5000 Å. The polycrystal silicon film has a reduced resistance and the polycide film 58 is constructed by a metal having a high melting point, etc. Further, an insulating film 68 such as a silicon nitride film is deposited on the polycrystal silicon film or the polycide film 58 such that this insulating film 68 has a thickness from 1000 to 5000 Å. These films 68 and 58 are then patterned to form a word line layer. FIG. 6d is a cross-sectional view of the semiconductor device taken along a chain line of FIG. 6a.

Figure 6B:
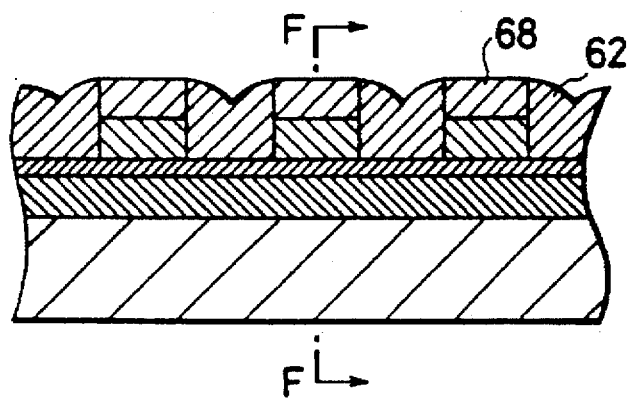

(B) As shown in FIG. 6b, an insulating film 62 such as a silicon oxide film is deposited by a CVD method, etc. such that this insulating film has a thickness sufficient to bury patterns of the above films 58 and 68 by this insulating film 62. The insulating film 82 is constructed by an insulating film of a kind different from the insulating film 68.

Thereafter, a surface of the insulating film 62 is flattened by using a method such as coating of an SOG film. Then, only a portion of the insulating film 82 between the two pattern layer films 58 and 88 is left by etchback such that only the insulating film 68 exists on the polycrystal silicon film or the polycide film 88 as a word line layer. FIG. 6e is a cross-sectional view of the semiconductor device taken along a chain line of FIG. 6b.

Figure 6C:
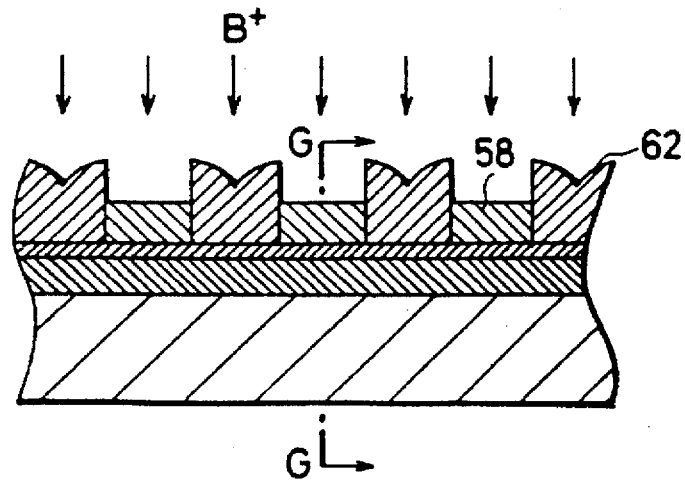
Figure 6D:
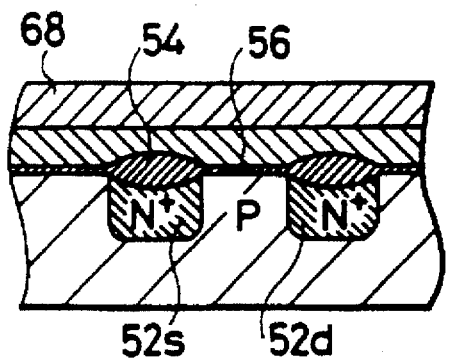
Figure 6E:
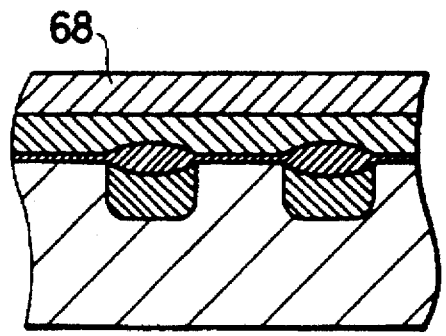
Figure 6F:
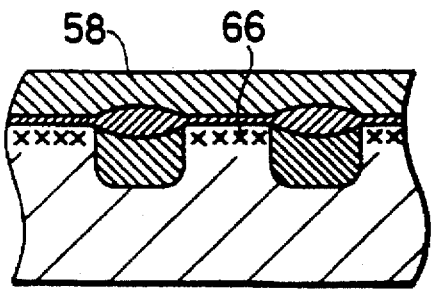

(C) Thereafter, the insulating film 68 is selectively removed from the substrate as shown in FIG. 6c. For example, when the insulating film 68 is constructed by a silicon nitride film, the silicon nitride film can be selectively removed from the substrate by etching this silicon nitride film by using phosphoric acid. FIG. 6f is a cross-sectional view of the semiconductor device taken along a chain line of FIG. 6c. FIG. 6f shows a state of FIG. 5 (see FIG. 5c).

Thereafter, core implantation is performed. The thick insulating film 62 exists between the word line films 58 and 68 so that no ion for the core implantation is implanted into the diffusion regions 52s and 52d below the insulating film 62.

In this embodiment, only a memory section is shown, but a peripheral circuit is also included as a semiconductor memory device. The peripheral circuit can be formed in accordance with normal manufacturing processes.

As mentioned above, in a first structure of the present invention, a thick deposited insulating film is used as an insulating film for electrically insulating a bit line layer and a word line layer from each Other. Accordingly, a capacity between the bit line layer and the word line layer is reduced so that a reading speed of the semiconductor device can be increased.

The bit line layer has a high impurity concentration in a central portion thereof in a width direction and has a low impurity concentration in a peripheral portion thereof in the width direction, thereby providing an LDD structure. Accordingly, when a voltage is applied to the bit line layer, a proof pressure between a source and a drain is increased and the increased proof pressure is advantageous in a fine structure.

In a second structure of the present invention, an insulating film is buried between word line layers so that it is possible to restrain ions for core implantation from being implanted into diffusion regions. Accordingly, it is possible to restrain junction capacitance and junction leak from being increased.

In the second structure of the present invention, diffusion regions for a source and a drain, a gate oxide film and a word line layer are sequentially formed. Thereafter, an insulating film is deposited such that this insulating film has a thickness sufficient to be buried between the word line layers. Only a portion of the insulating film between the word line layers is left by etchback. Thereafter, a resist pattern having an opening in a channel region of a corresponding memory transistor in accordance with information to be stored is formed. Then, ions for core implantation are implanted into a substrate, etc. with this resist pattern as a mask. Accordingly, the semiconductor device can be manufactured with improved yield by combining these established techniques with each other.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of manufacturing core implanted semiconductor memory devices, comprising:

forming a plurality of masks on a substrate, each of said plurality of masks being spaced apart in a side by side relationship such that a diffusion region having a predefined width is defined for the space between each of said plurality of masks, each diffusion region being formed in a planar cell structure, and space between each diffusion region defines a channel region on said substrate;

implanting impurities in each diffusion region to form source and drain regions on said substrate, said source and drain regions are formed with a high impurity concentration in a central portion thereof relative to said width of said diffusion region and a low impurity concentration in edge portions thereof relative to the central portion of said diffusion region;

forming a first insulation film having a predefined thickness on said diffusion regions;

removing each of said plurality of masks so that each channel region is exposed;

forming a second insulation film having a predefined thickness on each channel region, said thickness of said second insulation layer being less than said thickness of said first insulation layer;

forming a word line layer in a direction crossing said diffusion regions and functioning as a gate electrode, said word line layer being electrically insulated from said diffusion regions by said first insulating film, and being in contact with said second insulating film formed on each channel region; implanting impurities in selected channel regions for writing information therein.

2. The method according to claim 1, wherein a conductivity type of said edge portions of each diffusion region is opposite to that of said substrate.

3. The method according to claim 1, wherein said predefined thickness of said first insulating film is at least 3000 Å.

4. A method for manufacturing core implanted semiconductor memory devices, comprising:

forming a plurality of masks on a substrate, each of said plurality of masks being spaced apart in a side by side relationship such that a diffusion region having a predefined width is defined for the space between each of said plurality of masks, each diffusion region being formed in a planar cell structure, and space between each diffusion region defines a channel region on said substrate;

implanting impurities in each diffusion region to form source and drain regions on said substrate, said source and drain regions are formed with a high impurity concentration in a central portion thereof relative to said width of said diffusion region and a low impurity concentration in edge portions thereof relative to the central portion of said diffusion region;

forming a first insulation film having a predefined thickness on said diffusion regions;

removing each of said plurality of masks so that each channel region is exposed;

forming a second insulation film having a predefined thickness on each channel region said thickness of said second insulation layer being less than said thickness of said first insulation layer;

forming a plurality of word line layers, wherein each of said plurality of word line layers is formed in a direction crossing said diffusion regions and functions as a gate electrode, and wherein each of said plurality of word line layers is electrically insulated from said diffusion regions through said first insulating film, and being in contact with said second insulating film formed on each channel region;

forming a third insulating film between said plurality of word line layers, such that when ions for writing information are implanted into said channel region of said substrate said third insulating film inhibits said ions from implanting in said diffusion regions; and implanting impurities in selected channel regions for writing information therein.

5. The method according to claim 4, wherein said third insulating film comprises a SOG film.

6. The method according to claim 4, wherein said third insulating film is formed by depositing an insulating film between said word line layers and removing a portion of the deposited insulating film by etching.

7. The method according to claim 4, wherein a conductivity type of said edge portions of each diffusion region having said low impurity concentration, is opposite to a conductivity type of said substrate.

8. The method according to claim 1, wherein each mask is formed using at least a silicon oxide film and a silicon nitride film.

9. The method according to claim 4, wherein each mask is formed using at least a silicon oxide film and a silicon nitride film.

* * * * *